US012586753B2

(12) United States Patent
Wang et al.

(10) Patent No.: US 12,586,753 B2
(45) Date of Patent: Mar. 24, 2026

(54) IMAGE ENHANCEMENT BASED ON CHARGE ACCUMULATION REDUCTION IN CHARGED-PARTICLE BEAM INSPECTION

(71) Applicant: ASML Netherlands B.V., Veldhoven (NL)

(72) Inventors: Xiang Wang, Portland, OR (US); Steffen Meyer, Portland, OR (US); Mark O'Mahony, Portland, OR (US)

(73) Assignee: ASML Netherlands B.V., Veldhoven (NL)

( * ) Notice: Subject to any disclaimer, the term of this patent is extended or adjusted under 35 U.S.C. 154(b) by 545 days.

(21) Appl. No.: 17/916,785

(22) PCT Filed: Mar. 31, 2021

(86) PCT No.: PCT/EP2021/058543
§ 371 (c)(1),
(2) Date: Oct. 3, 2022

(87) PCT Pub. No.: WO2021/198394
PCT Pub. Date: Oct. 7, 2021

(65) Prior Publication Data
US 2023/0162944 A1      May 25, 2023

Related U.S. Application Data

(60) Provisional application No. 63/005,074, filed on Apr. 3, 2020.

(51) Int. Cl.
H01J 37/22        (2006.01)
H01J 37/28        (2006.01)
(52) U.S. Cl.
CPC ............ H01J 37/222 (2013.01); H01J 37/28 (2013.01); H01J 2237/0044 (2013.01);
(Continued)

(58) Field of Classification Search
CPC .. H01J 37/00; H01J 37/02; H01J 37/22; H01J 37/222; H01J 37/26; H01J 37/28;
(Continued)

(56) References Cited

U.S. PATENT DOCUMENTS 5,006,795 A * 4/1991 Yoshizawa ............ H01J 37/268
                                                              250/311
8,294,094 B1 * 10/2012 Zhao ..................... G01N 23/225
                                                              250/306
(Continued)

FOREIGN PATENT DOCUMENTS

JP          H07-14537          1/1995
JP          2000-195459 A      7/2000
(Continued)

OTHER PUBLICATIONS

Office Action of the Intellectual Property Office issued in related Taiwanese Patent Application No. 110112087; mailed Jun. 28, 2022 (11 pgs.).
(Continued)

*Primary Examiner* — Jason L Mccormack
(74) *Attorney, Agent, or Firm* — FINNEGAN, HENDERSON, FARABOW, GARRETT & DUNNER LLP

(57) ABSTRACT

An improved method and apparatus for enhancing an inspection image in a charged-particle beam inspection system. An improved method for enhancing an inspection image comprises acquiring a plurality of test images of a sample that are obtained at different landing energies, determining distortion levels for the plurality of test images, determining a landing energy level that enables the sample to be in a neutral charge condition during inspection based on the distortion levels, and acquiring an inspection image based on the determined landing energy level.

20 Claims, 10 Drawing Sheets

(52) U.S. Cl.
    CPC .................. *H01J 2237/2809* (2013.01); *H01J*
            *2237/2817* (2013.01); *H01J 2237/282*
                                    (2013.01)

(58) Field of Classification Search
    CPC ....... H01J 2237/0044; H01J 2237/2809; H01J
            2237/2817; H01J 2237/282; H01J
            2237/153; H01J 2237/221
    USPC ................................ 250/306, 307, 310, 311
    See application file for complete search history.

(56) References Cited

U.S. PATENT DOCUMENTS

|  |  |  |  |  |
|---|---|---|---|---|
| 9,224,576 | B2 | 12/2015 | Knippelmeyer et al. | |
| 2005/0104017 | A1* | 5/2005 | Kimba .................... | H01J 37/29 250/559.07 |
| 2009/0090863 | A1* | 4/2009 | Watanabe .......... | G01N 23/2251 250/307 |
| 2011/0240854 | A1* | 10/2011 | Terada .................... | H01J 37/05 250/311 |
| 2012/0074316 | A1* | 3/2012 | Watanabe ............... | H01J 37/29 250/307 |
| 2012/0228494 | A1* | 9/2012 | Kuan ........................ | G03F 1/86 250/307 |
| 2015/0090877 | A1* | 4/2015 | Fan .................... | G01N 23/2251 250/307 |
| 2015/0270094 | A1 | 9/2015 | Ikku | |
| 2018/0182595 | A1 | 6/2018 | Yokosuka et al. | |

FOREIGN PATENT DOCUMENTS

| JP | 2008-076070 A | 4/2008 |
|---|---|---|
| JP | 2012-033336 A | 2/2012 |
| TW | I669742 B | 8/2019 |

OTHER PUBLICATIONS

Notice of Reasons for Rejection from the Japan Patent Office issued in related Japanese Patent Application No. 2022-555847; mailed Aug. 9, 2023 (14 pgs.).

* cited by examiner

100

300

400

500

610 d3

611          302

700

IMAGE ENHANCEMENT BASED ON CHARGE ACCUMULATION REDUCTION IN CHARGED-PARTICLE BEAM INSPECTION

CROSS-REFERENCE TO RELATED APPLICATIONS

This application claims priority to International Application No. PCT/EP2021/058543, filed Mar. 31, 2021, and published as WO 2021/198394 A1, which claims priority of U.S. application 63/005,074 which was filed on Apr. 3, 2020. The contents of these applications are incorporated herein by reference in their entireties.

TECHNICAL FIELD

The embodiments provided herein relate to an image enhancement technology, and more particularly to inspection image enhancement based on charge accumulation reduction on a wafer in charged-particle beam inspection.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more important.

Pattern/structure displacements and dimension deviations from designs can be measured from a SEM image with sub-nanometer (nm) precision. These measurements can be helpful in identifying defects of manufactured ICs and in controlling manufacturing processes. Charge accumulation on a wafer during inspection may cause distortion, defocus, and abnormal grey level of a SEM image and thereby cause an error in measuring critical dimensions and overlays and detecting defects from the SEM image.

SUMMARY

The embodiments provided herein disclose a particle beam inspection apparatus, and more particularly, an inspection apparatus using a charged particle beam.

In some embodiments, a method for enhancing an inspection image in a charged-particle beam inspection system is provided. The method comprises acquiring a plurality of test images of a sample that are obtained at different landing energies, determining distortion levels for the plurality of test images, determining a landing energy level that enables the sample to be in a neutral charge condition during inspection based on the distortion levels, and acquiring an inspection image based on the determined landing energy level.

In some embodiments, an image enhancing apparatus comprises a memory storing a set of instructions and at least one processor configured to execute the set of instructions to cause the apparatus to perform acquiring a plurality of test images of a sample that are obtained at different landing energies, determining distortion levels for the plurality of test images, determining a landing energy level that enables the sample to be in a neutral charge condition during inspection based on the distortion levels, and acquiring an inspection image based on the determined landing energy level.

In some embodiments, a non-transitory computer readable medium that stores a set of instructions that is executable by at least one processor of a computing device to perform a method for enhancing an image is provided. The method comprises acquiring a plurality of test images of a sample that are obtained at different landing energies, determining distortion levels for the plurality of test images, determining a landing energy level that enables the sample to be in a neutral charge condition during inspection based on the distortion levels, and acquiring an inspection image based on the determined landing energy level.

In some embodiments, a method for identifying an optimum landing energy in a charged-particle beam inspection system is provided. The method comprises acquiring a plurality of test images of a sample that are obtained at different landing energies, determining distortion levels for the plurality of test images, wherein determining distortion levels comprises comparing a first test image with a first reference image corresponding to the first test image based on positions of features in the first test image and the first reference image, and determining a landing energy level that enables the sample to be in a neutral charge condition during inspection based on the distortion levels.

In some embodiments, a method for enhancing an inspection image in a charged-particle beam inspection system is provided. The method comprises acquiring a first test image and a second test image of a sample, wherein the first test image and the second test image are obtained at different landing energies, determining a first distortion level for the first test image and a second distortion level for the second test image, determining a landing energy level that enables a distortion level to be substantially zero when inspecting the sample, the determination of the landing energy level being based on the first distortion level, the second distortion level, and the different landing energies, and acquiring an inspection image based on the determined landing energy level.

Other advantages of the embodiments of the present disclosure will become apparent from the following description taken in conjunction with the accompanying drawings wherein are set forth, by way of illustration and example, certain embodiments of the present invention.

DETAILED DESCRIPTION

Figure 1:
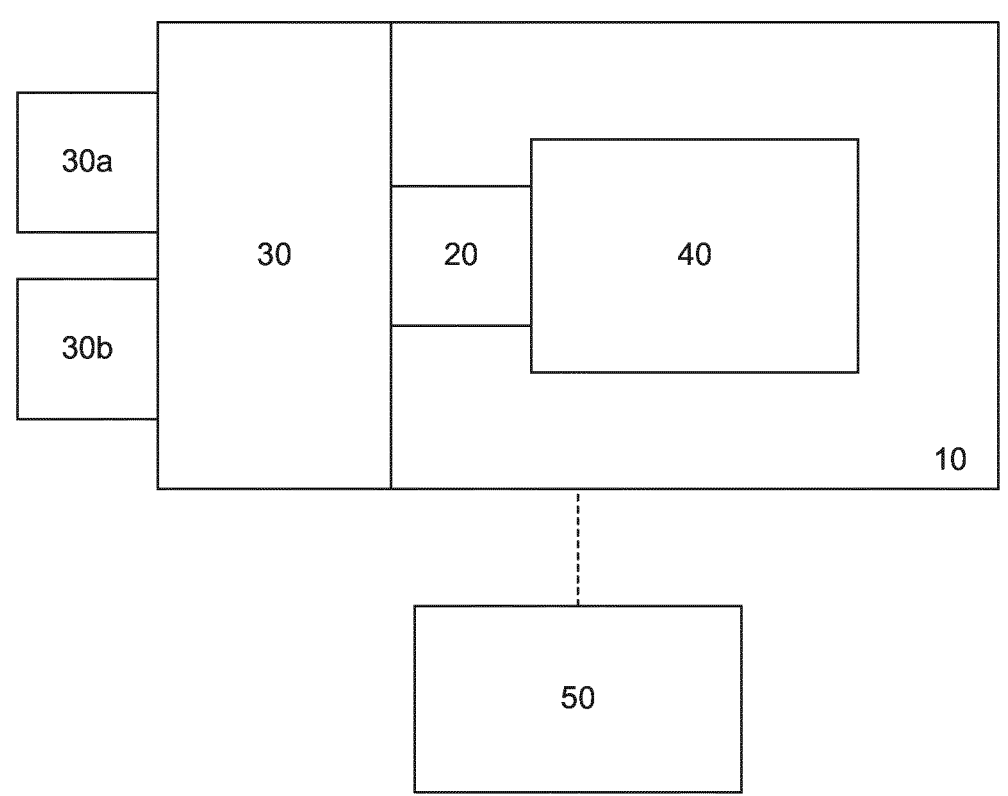
FIG. 1 is a schematic diagram illustrating an example electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

Critical dimensions of patterns/structures measured from a SEM image can be used when identifying defects of manufactured ICs. For example, shifts between patterns or edge placement variations, which are determined from measured critical dimensions, can be helpful in identifying defects and in controlling manufacturing processes. When there is imbalance between incoming primary electrons and outgoing secondary electrons, charge can accumulate on a wafer during inspection. Such charge accumulation may cause significant distortion, defocus, and abnormal grey level of a SEM image and thereby cause an error in measuring critical dimensions from the SEM image.

Some embodiments of the present disclosure provide a technique for identifying an energy level that enables the ability to balance a charge on the sample during inspection. Inspecting the sample based on the identified energy level can assist with providing a more accurate SEM image and thus enables detecting defects of a sample with higher accuracy and efficiency. In the present disclosure, identifying a neutral energy level and inspecting a sample based on the identified neutral energy level can be automated.

Relative dimensions of components in drawings may be exaggerated for clarity. Within the following description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which illustrates an example electron beam inspection (EBI) system 100 consistent with embodiments of the present disclosure. As shown in FIG. 1, charged particle beam inspection system 100 includes a main chamber 10, a load-lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30*a* and a second loading port 30*b*. EFEM 30 may include additional loading port(s). First loading port 30*a* and second loading port 30*b* receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load-lock chamber 20.

Load-lock chamber 20 is connected to a load/lock vacuum pump system (not shown), which removes gas molecules in load-lock chamber 20 to reach a first pressure below the atmospheric pressure. After reaching the first pressure, one or more robot arms (not shown) transport the wafer from load-lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam inspection tool. In other embodiments, electron beam tool 40 may comprise a multi-beam inspection tool.

Controller 50 may be electronically connected to electron beam tool 40 and may be electronically connected to other components as well. Controller 50 may be a computer configured to execute various controls of charged particle beam inspection system 100. Controller 50 may also include processing circuitry configured to execute various signal and image processing functions. While controller 50 is shown in FIG. 1 as being outside of the structure that includes main chamber 10, load-lock chamber 20, and EFEM 30, it is appreciated that controller 50 can be part of the structure.

While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
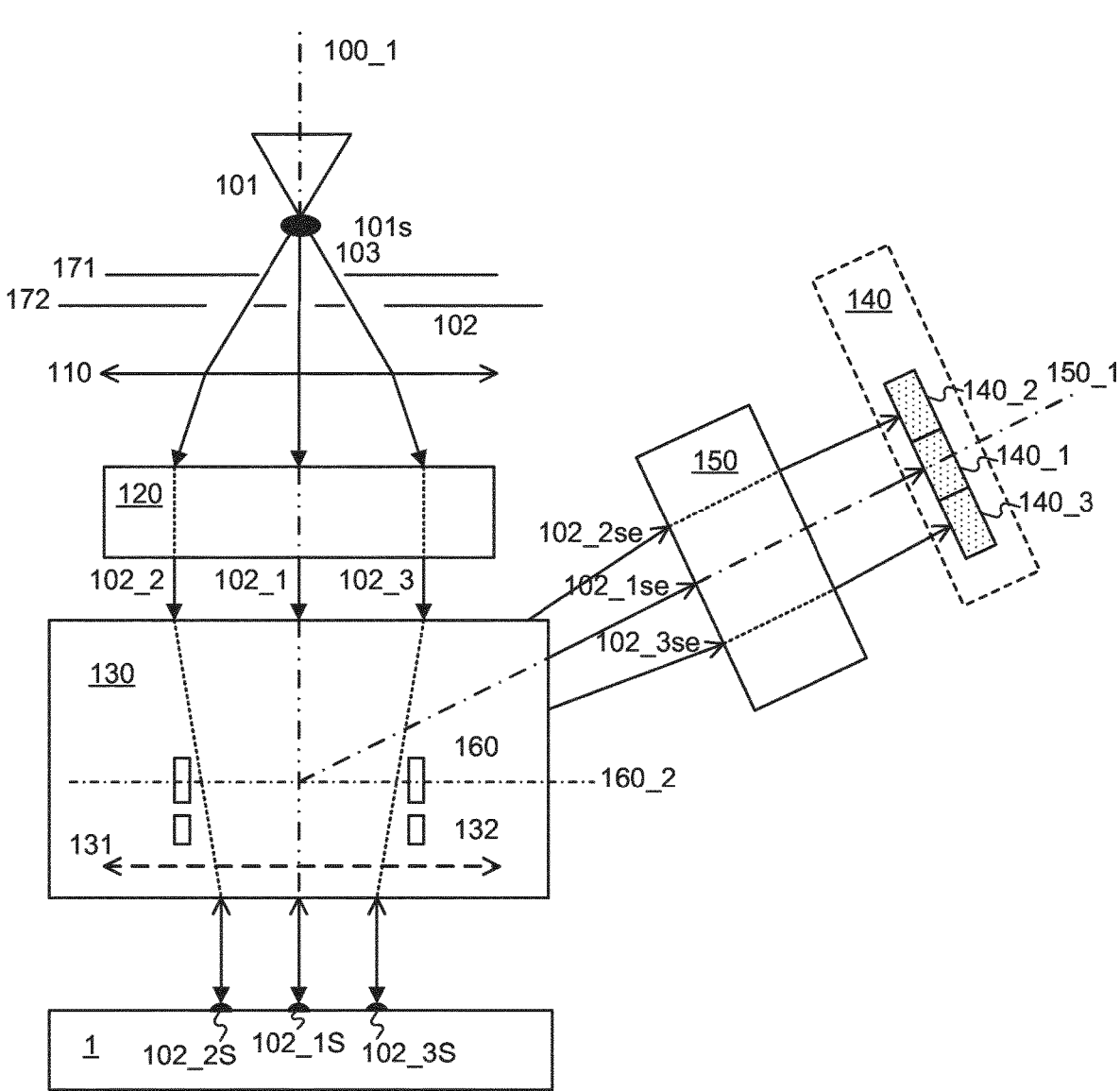
FIG. 2 is a schematic diagram illustrating an example electron beam tool that can be a part of the electron beam inspection system of FIG. 1, consistent with embodiments of the present disclosure.

Reference is now made to FIG. 2, which illustrates a schematic diagram illustrating an example electron beam tool 40 that can be a part of the example charged particle beam inspection system 100 of FIG. 1, consistent with embodiments of the present disclosure. An electron beam tool 40 (also referred to herein as apparatus 40) comprises an electron source 101, a gun aperture plate 171 with a gun aperture 103, a pre-beamlet forming mechanism 172, a condenser lens 110, a source conversion unit 120, a primary projection optical system 130, a sample stage (not shown in FIG. 2), a secondary imaging system 150, and an electron detection device 140. Primary projection optical system 130 can comprise an objective lens 131. Electron detection device 140 can comprise a plurality of detection elements 140_1, 140_2, and 140_3. Beam separator 160 and deflection scanning unit 132 can be placed inside primary projection optical system 130. It may be appreciated that other commonly known components of apparatus 40 may be added/omitted as appropriate.

Electron source 101, gun aperture plate 171, condenser lens 110, source conversion unit 120, beam separator 160, deflection scanning unit 132, and primary projection optical system 130 can be aligned with a primary optical axis 100_1 of apparatus 100. Secondary imaging system 150 and electron detection device 140 can be aligned with a secondary optical axis 150_1 of apparatus 40.

Electron source 101 can comprise a cathode, an extractor or an anode, wherein primary electrons can be emitted from the cathode and extracted or accelerated to form a primary electron beam 102 that forms a crossover (virtual or real) 101$s$. Primary electron beam 102 can be visualized as being emitted from crossover 101$s$.

Source conversion unit 120 may comprise an image-forming element array (not shown in FIG. 2), an aberration compensator array (not shown), a beam-limit aperture array (not shown), and a pre-bending micro-deflector array (not shown). The image-forming element array can comprise a plurality of micro-deflectors or micro-lenses to form a plurality of parallel images (virtual or real) of crossover 101$s$ with a plurality of beamlets of primary electron beam 102. FIG. 2 shows three beamlets 102_1, 102_2, and 102_3 as an example, and it is appreciated that the source conversion unit 120 can handle any number of beamlets.

In some embodiments, source conversion unit 120 may be provided with beam-limit aperture array and image-forming element array (both are not shown). The beam-limit aperture array may comprise beam-limit apertures. It is appreciated that any number of apertures may be used, as appropriate. Beam-limit apertures may be configured to limit sizes of beamlets 102_1, 102_2, and 102_3 of primary-electron beam 102. The image-forming element array may comprise image-forming deflectors (not shown) configured to deflect beamlets 102_1, 102_2, and 102_3 by varying angles towards primary optical axis 100_1. In some embodiments, deflectors further away from primary optical axis 100_1 may deflect beamlets to a greater extent. Furthermore, image-forming element array may comprise multiple layers (not illustrated), and deflectors may be provided in separate layers. Deflectors may be configured to be individually controlled independent from one another. In some embodiments, a deflector may be controlled to adjust a pitch of probe spots (e.g., 102_1S, 102_2S, and 102_3S) formed on a surface of sample 1. As referred to herein, pitch of the probe spots may be defined as the distance between two immediately adjacent probe spots on the surface of sample 1.

A centrally located deflector of image-forming element array may be aligned with primary optical axis 100_1 of electron beam tool 40. Thus, in some embodiments, a central deflector may be configured to maintain the trajectory of beamlet 102_1 to be straight. In some embodiments, the central deflector may be omitted. However, in some embodiments, primary electron source 101 may not necessarily be aligned with the center of source conversion unit 120. Furthermore, it is appreciated that while FIG. 2 shows a side view of apparatus 40 where beamlet 102_1 is on primary optical axis 100_1, beamlet 102_1 may be off primary optical axis 100_1 when viewed from a different side. That is, in some embodiments, all of beamlets 102_1, 102_2, and 102_3 may be off-axis. An off-axis component may be offset relative to primary optical axis 100_1.

The deflection angles of the deflected beamlets may be set based on one or more criteria. In some embodiments, deflectors may deflect off-axis beamlets radially outward or away (not illustrated) from primary optical axis 100_1. In some embodiments, deflectors may be configured to deflect off-axis beamlets radially inward or towards primary optical axis 100_1. Deflection angles of the beamlets may be set so that beamlets 102_1, 102_2, and 102_3 land perpendicularly on sample 1. Off-axis aberrations of images due to lenses, such as objective lens 131, may be reduced by adjusting paths of the beamlets passing through the lenses. Therefore, deflection angles of off-axis beamlets 102_2 and 102_3 may be set so that probe spots 102_2S and 102_3S have small aberrations. Beamlets may be deflected so as to pass through or close to the front focal point of objective lens 131 to decrease aberrations of off-axis probe spots 102_2S and 102_3S. In some embodiments, deflectors may be set to make beamlets 102_1, 102_2, and 102_3 land perpendicularly on sample 1 while probe spots 102_1S, 102_2S, and 102_3S have small aberrations.

Condenser lens 110 is configured to focus primary electron beam 102. The electric currents of beamlets 102_1, 102_2, and 102_3 downstream of source conversion unit 120 can be varied by adjusting the focusing power of condenser lens 110 or by changing the radial sizes of the corresponding beam-limit apertures within the beam-limit aperture array. The electric currents may be changed by both, altering the radial sizes of beam-limit apertures and the focusing power of condenser lens 110. Condenser lens 110 may be an adjustable condenser lens that may be configured so that the position of its first principle plane is movable. The adjustable condenser lens may be configured to be magnetic, which may result in off-axis beamlets 102_2 and 102_3 illuminating source conversion unit 120 with rotation angles. The rotation angles may change with the focusing power or the position of the first principal plane of the adjustable condenser lens. Accordingly, condenser lens 110 may be an anti-rotation condenser lens that may be configured to keep the rotation angles unchanged while the focusing power of condenser lens 110 is changed. In some embodiments, condenser lens 110 may be an adjustable anti-rotation condenser lens, in which the rotation angles do not change when the focusing power and the position of the first principal plane of condenser lens 110 are varied.

Electron beam tool 40 may comprise pre-beamlet forming mechanism 172. In some embodiments, electron source 101 may be configured to emit primary electrons and form a primary electron beam 102. In some embodiments, gun aperture plate 171 may be configured to block off peripheral electrons of primary electron beam 102 to reduce the Coulomb effect. In some embodiments, pre-beamlet-forming mechanism 172 further cuts the peripheral electrons of primary electron beam 102 to further reduce the Coulomb effect. Primary-electron beam 102 may be trimmed into three primary electron beamlets 102_1, 102_2, and 102_3 (or any other number of beamlets) after passing through pre-beamlet forming mechanism 172. Electron source 101, gun aperture plate 171, pre-beamlet forming mechanism 172, and condenser lens 110 may be aligned with a primary optical axis 100_1 of electron beam tool 40.

Pre-beamlet forming mechanism 172 may comprise a Coulomb aperture array. A center aperture, also referred to herein as the on-axis aperture, of pre-beamlet-forming mechanism 172 and a central deflector of source conversion unit 120 may be aligned with primary optical axis 100_1 of electron beam tool 40. Pre-beamlet-forming mechanism 172 may be provided with a plurality of pre-trimming apertures (e.g., a Coulomb aperture array). In FIG. 2, the three beamlets 102_1, 102_2 and 102_3 are generated when primary electron beam 102 passes through the three pre-trimming apertures, and much of the remaining part of primary electron beam 102 is cut off. That is, pre-beamlet-forming mechanism 172 may trim much or most of the electrons from primary electron beam 102 that do not form the three beamlets 102_1, 102_2 and 102_3. Pre-beamlet-forming mechanism 172 may cut off electrons that will ultimately not be used to form probe spots 102_1S, 102_2S and 102_3S before primary electron beam 102 enters source conversion unit 120. In some embodiments, a gun aperture plate 171 may be provided close to electron source 101 to cut off electrons at an early stage, while pre-beamlet forming mechanism 172 may be also provided to further cut off electrons around a plurality of beamlets. Although FIG. 2 demonstrates three apertures of pre-beamlet forming mechanism 172, it is appreciated that there may be any number of apertures, as appropriate.

In some embodiments, pre-beamlet forming mechanism 172 may be placed below condenser lens 110. Placing pre-beamlet forming mechanism 172 closer to electron source 101 may more effectively reduce the Coulomb effect. In some embodiments, gun aperture plate 171 may be omitted when pre-beamlet forming mechanism 172 is able to be located sufficiently close to source 101 while still being manufacturable.

Objective lens 131 may be configured to focus beamlets 102_1, 102_2, and 102_3 onto a sample 1 for inspection and can form three probe spots 102_1s, 102_2s, and 102_3s on surface of sample 1. Gun aperture plate 171 can block off peripheral electrons of primary electron beam 102 not in use to reduce Coulomb interaction effects. Coulomb interaction effects can enlarge the size of each of probe spots 102_1s, 102_2s, and 102_3s, and therefore deteriorate inspection resolution.

Beam separator 160 may be a beam separator of Wien filter type comprising an electrostatic deflector generating an electrostatic dipole field E1 and a magnetic dipole field B1 (both of which are not shown in FIG. 2). If they are applied, the force exerted by electrostatic dipole field E1 on an electron of beamlets 102_1, 102_2, and 102_3 is equal in magnitude and opposite in direction to the force exerted on the electron by magnetic dipole field B1. Beamlets 102_1, 102_2, and 102_3 can therefore pass straight through beam separator 160 with zero deflection angles.

Deflection scanning unit 132 can deflect beamlets 102_1, 102_2, and 102_3 to scan probe spots 102_1s, 102_2s, and 102_3s over three small scanned areas in a section of the surface of sample 1. In response to incidence of beamlets 102_1, 102_2, and 102_3 at probe spots 102_1s, 102_2s, and 102_3s, three secondary electron beams 102_1se, 102_2se, and 102_3se may be emitted from sample 1. Each of secondary electron beams 102_1se, 102_2se, and 102_3se can comprise electrons with a distribution of energies including secondary electrons (energies ≤50 eV) and back-scattered electrons (energies between 50 eV and landing energies of beamlets 102_1, 102_2, and 102_3). Beam separator 160 can direct secondary electron beams 102_1se, 102_2se, and 102_3se towards secondary imaging system 150. Secondary imaging system 150 can focus secondary electron beams 102_1se, 102_2se, and 102_3se onto detection elements 1401, 1402, and 1403 of electron detection device 140. Detection elements 140_1, 140_2, and 140_3 can detect corresponding secondary electron beams 102_1se, 102_2se, and 102_3se and generate corresponding signals used to construct images of the corresponding scanned areas of sample 1.

In FIG. 2, three secondary electron beams 102_1se, 102_2se, and 102_3se respectively generated by three probe spots 102_1S, 102_2S, and 102_3S, travel upward towards electron source 101 along primary optical axis 100_1, pass through objective lens 131 and deflection scanning unit 132 in succession. The three secondary electron beams 102_1se, 102_2se and 102_3se are diverted by beam separator 160 (such as a Wien Filter) to enter secondary imaging system 150 along secondary optical axis 150_1 thereof. Secondary imaging system 150 focuses the three secondary electron beams 102_1se 102_3se onto electron detection device 140 which comprises three detection elements 140_1, 140_2, and 140_3. Therefore, electron detection device 140 can simultaneously generate the images of the three scanned regions scanned by the three probe spots 102_1S, 102_2S and 102_3S, respectively. In some embodiments, electron detection device 140 and secondary imaging system 150 form one detection unit (not shown). In some embodiments, the electron optics elements on the paths of secondary electron beams such as, but not limited to, objective lens 131, deflection scanning unit 132, beam separator 160, secondary imaging system 150 and electron detection device 140, may form one detection system.

In some embodiments, a controller (e.g., controller 50 of FIG. 1) may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 140 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 140 and may construct an image. The image acquirer may thus acquire images of sample 1. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on one or more imaging signals received from electron detection device 140. An imaging signal may correspond to a scanning operation for conducting charged particle imaging. An acquired image may be a single image comprising a plurality of imaging areas or may involve multiple images. The single image may be stored in the storage. The single image may be an original image that may be divided into a plurality of regions. Each of the regions may comprise one imaging area containing a feature of sample 1. The acquired images may comprise multiple images of a single imaging area of sample 1 sampled multiple times over a time sequence or may comprise multiple images of different imaging areas of sample 1. The multiple images may be stored in the storage. In some embodiments, controller 50 may be configured to perform image processing steps with the multiple images of the same location of sample 1.

In some embodiments, the controller may include measurement circuitries (e.g., analog-to-digital converters) to obtain a distribution of the detected secondary electrons. The electron distribution data collected during a detection time window, in combination with corresponding scan path data of each of primary beamlets $102\_1$, $102\_2$, and $102\_3$ incident on the wafer surface, can be used to reconstruct images of the wafer structures under inspection. The reconstructed images can be used to reveal various features of the internal or external structures of sample 1, and thereby can be used to reveal any defects that may exist in the wafer.

In some embodiments, the controller may control a motorized stage (not shown) to move sample 1 during inspection. In some embodiments, the controller may enable the motorized stage to move sample 1 in a direction continuously at a constant speed. In other embodiments, the controller may enable the motorized stage to change the speed of the movement of sample 1 over time depending on the steps of scanning process. In some embodiments, the controller may adjust a configuration of primary projection optical system 130 or secondary imaging system 150 based on images of secondary electron beams $102\_1se$, $102\_2se$, and $102\_3se$.

Although FIG. 2 shows that electron beam tool 40 uses three primary electron beams, it is appreciated that electron beam tool 40 may use two or more number of primary electron beams. The present disclosure does not limit the number of primary electron beams used in apparatus 40.

Figure 3A:
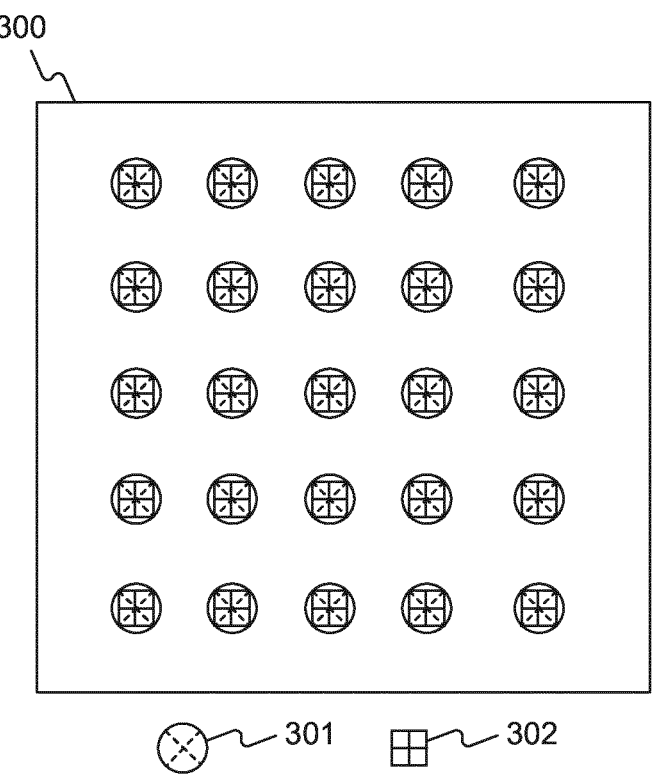
FIG. 3A is an example comparison of feature positions in an inspection image taken under a neutral charge condition with reference feature positions.

Reference is now made to FIG. 3A, which is an example comparison of feature positions in an inspection image taken under a neutral charge condition with reference feature positions. In this disclosure, a neutral charge condition can refer to a sample status during inspection where primary electrons incident on a sample is balanced with secondary electrons emitting from the sample and thus no charge accumulates on the sample. A feature can refer to a pattern or structure formed on a sample. In FIG. 3A, a first inspection image 300 can be obtained by a charged-particle beam inspection system (e.g., electron beam inspection system 100 of FIG. 1). For example, first inspection image 300 can be an electron beam image generated based on an electron detection signal from electron detection element 140. First inspection image 300 can be an inspection image of a sample comprising multiple features. In FIG. 3A, positions 301 of features on first inspection image 300 are indicated as circles. It will be appreciated that patterns of features are not indicted in first inspection image 300 of FIG. 3A for purposes of simplicity.

FIG. 3A also shows reference positions 302 (e.g., indicated as squares) of features superimposed on inspection image 300. According to embodiments of the present disclosure, reference positions 302 of features on a sample can be obtained from a reference image corresponding to the sample. In some embodiments, a reference image can be a ground truth image of a sample. A ground truth image can include a raw image of a wafer or die containing the corresponding pattern or can include a ground truth wafer map measured from a wafer or die containing the corresponding pattern, among others. In some embodiments, a reference image can comprise a wafer design layout of a corresponding sample, such as in a in Graphic Database System (GDS) format, Graphic Database System II (GDS II) format, an Open Artwork System Interchange Standard (OASIS) format, a Caltech Intermediate Format (CIF), etc. The wafer design layout may be based on a pattern layout for constructing the wafer. In some embodiments, a reference image, among others, may comprise feature information stored in a binary file format representing planar geometric shapes, text, and other information related to wafer design layout. As shown in FIG. 3A, when a sample is inspected under a neutral charge condition, positions 301 of features on first inspection image 300 match reference positions 302 of features in a reference image.

However, when inspecting a sample under a charge build-up condition such as a negative charge condition or a positive charge condition, an inspection image can be distorted. In this disclosure, a negative charge condition can refer to a sample status during inspection where an amount of primary electrons incident on a sample is larger than that of secondary electrons emitting from the sample and thus negative charge accumulates on the sample. Similarly, a positive charge condition can refer to a sample status during inspection where an amount of primary electrons incident on a sample is smaller than that of secondary electrons emitting from the sample and thus positive charge accumulates on the sample.

Figure 3B:
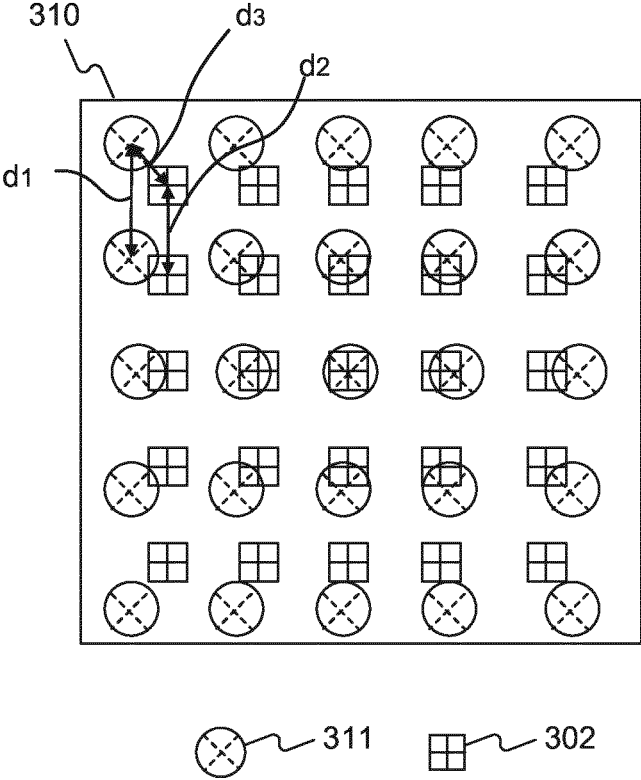
FIG. 3B is an example comparison of feature positions in an inspection image taken under a negative charge condition with reference feature positions.
Figure 3C:
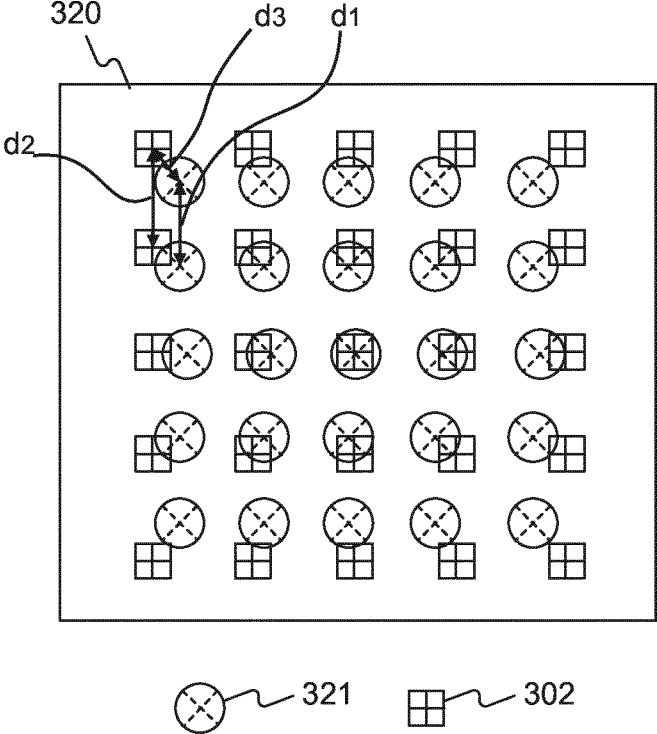
FIG. 3C is an example comparison of feature positions in an inspection image taken under a positive charge condition with reference feature positions.

As shown in FIG. 3B illustrating an example comparison of feature positions in an inspection image under a negative charge condition with reference feature positions, a second inspection image 310 taken under a negative charge condition can expand. In FIG. 3B, a distance (e.g., $d_1$) between two positions among positions 311 of features on second inspection image 310 is greater than a reference distance (e.g., $d_2$) between two reference positions 302 of corresponding features. As shown in FIG. 3C illustrating an example comparison of feature positions in an inspection image under a positive charge condition with reference feature positions, a third inspection image 320 taken under a positive charge condition can shrink. As shown in FIG. 3C, a distance (e.g., $d_1$) between two positions among positions 321 of features on third inspection image 320 is smaller than a reference distance (e.g., $d_2$) between two reference positions 302 of corresponding features. While image expansion and image contraction are discussed as a type of distortion occurred due to charge accumulation on a sample (e.g., as shown FIGS. 3B, 3C, and 6) in this disclosure, it is appreciated that a different type of distortion such as defocus, pattern shape distortion (e.g., pillow-shape or asymmetric-trapezoid distortions), etc. can also occur due to the charge accumulation.

As explained with respect to FIG. 3A to FIG. 3C, charge accumulation on a sample may bend electron beams that are used to scan the sample and result in significant distortion of a feature position or displacement on an inspection image. Such distortion may lead to errors in detecting critical dimensions, edge displacements, etc. from an inspection image. Embodiments of the present disclosure can provide techniques to determine a landing energy that enables the ability to balance a charge on the sample and thereby to provide a more accurate SEM image.

Figure 4:
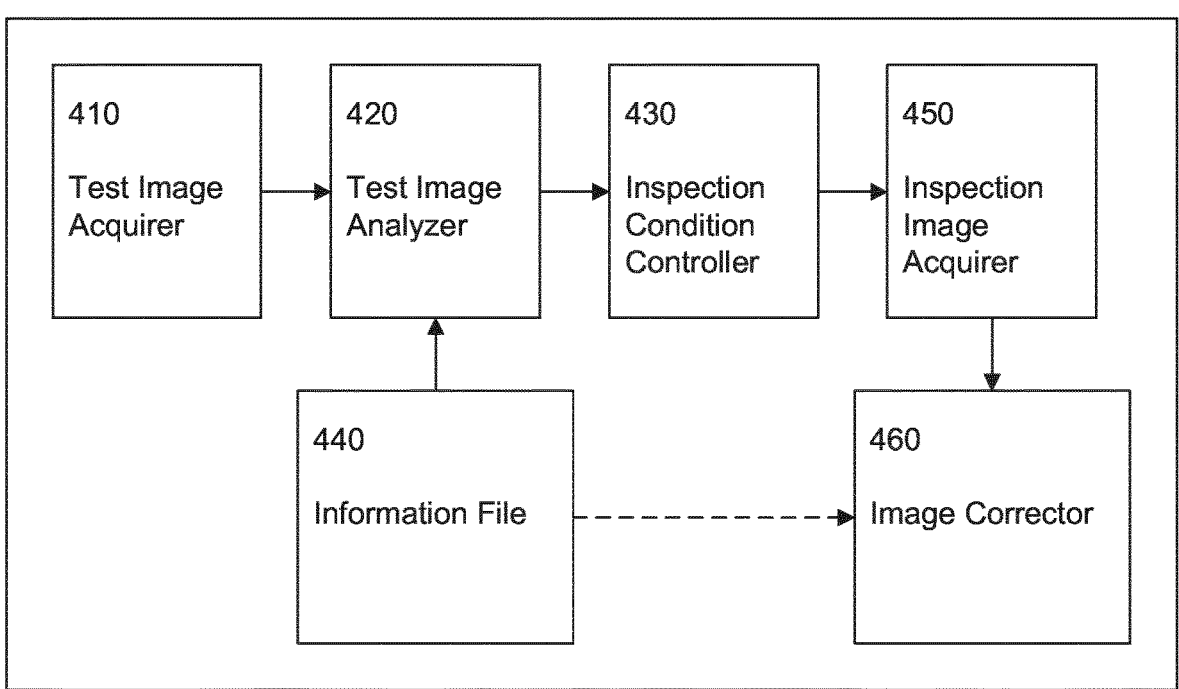
FIG. 4 is a block diagram of an example image enhancement apparatus, consistent with embodiments of the present disclosure.

FIG. 4 is a block diagram of an example image enhancement apparatus 400, consistent with embodiments of the present disclosure. It is appreciated that in various embodiments image enhancement apparatus 400 may be part of or may be separate from a charged-particle beam inspection system (e.g., electron beam inspection system 100 of FIG. 1). In some embodiments, image enhancement apparatus 400 may be part of controller 50 and may include an image acquirer, measurement circuitry, or storage, or the like. In some embodiments, image enhancement apparatus 400 may comprise an image processing system and may include an image acquirer, storage, or the like.

As illustrated in FIG. 4, image enhancement apparatus 400 may include a test image acquirer 410, test image analyzer 420, an inspection condition controller 430, and an inspection image acquirer.

Test image acquirer 410 is configured to receive a plurality of test images, consistent with embodiments of the present disclosure. A test image can be an inspection image for a region of a sample. A plurality of test images can be taken at different landing energies. In some embodiments, a plurality of test images can be taken for different test regions of a sample. For example, multiple test regions can be chosen for testing and a corresponding test image can be taken for each test region. In some embodiments, a plurality of test images for different test regions of a sample can be taken at the same time, such as via a multi-beam SEM. In this case, testing regions for the plurality of test images can be spaced apart such that one test region is not affected by an electron beam for other test region during testing. In some other embodiments, a plurality of test images can be taken for a region of a sample sequentially. In some embodiments, test image acquirer 410 may generate a test image based on a detection signal from electron detection device 140 of electron beam tool 40. In some embodiments, test image acquirer 410 may be part of or may be separate from an image acquirer included in controller 50. In some embodiments, test image acquirer 410 may obtain a test image generated by an image acquirer included in controller 50. In some embodiments, test image acquirer 410 may obtain a test image from a storage device or system storing the test image. In some embodiments, to reduce a processing time and resource, a test image can be obtained for a small portion of a sample.

Figure 5:
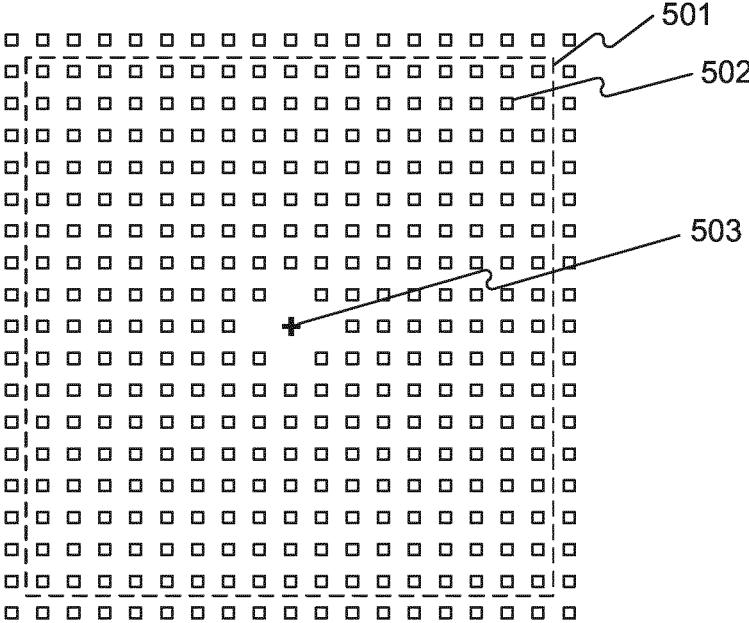
FIG. 5 is an example test region on a sample, consistent with embodiments of the present disclosure.

According to embodiments of the present disclosure, a test region on a sample can be chosen such that an image distortion such as image expansion or image contraction is measured from its corresponding test image. FIG. 5 illustrates an example of a test region 501 on a sample 500, consistent with embodiments of the present disclosure. As shown in FIG. 5, test region 501 can comprise multiple features 502 therein and a center 503 of test region 501 is also indicated for an illustration purpose. While FIG. 5 illustrates regularly arranged features 502, it will be appreciated that features 502 included in test region 501 may not be regularly arranged Similarly, features 502 included in test region 501 can have different shapes even though FIG. 5 illustrates features 502 having the same shape. In some embodiments, an area of test region 501 can correspond to a field of view of a primary electron beam (e.g., beamlets 102_1, 102_2, or 102_3). Choosing a region having multiple features 502 as test region 501 is one of several ways to enable measuring image distortion (e.g., image expansion or image extraction) of a test image based on feature displacements. In some embodiments, a sample can include an area that is designed or designated to be a test region and that includes multiple features 502, which is advantageous in determining a distortion level of a test image therefrom.

When a plurality of test images are taken for different test regions of sample 500, a plurality of test regions on different portions of sample 500 can be chosen for the plurality of test images. Similarly, each of the plurality of test regions can have multiple features (e.g., 502). In some embodiments, choosing a plurality of test regions having similar patterns or features can be advantageous in comparing displacement measurements (e.g., distortion levels) of a plurality of test images corresponding to the plurality of test regions. In some embodiments, a sample can include a plurality of areas that are designed or designated to be test regions and that include multiple features 502 having the same shape as each other, which is advantageous in comparing distortion levels of test images therefrom. In some embodiments, the plurality of areas can include a feature at the same relative position in each area. In some embodiments, a distance between adjacent two test regions can be large enough that one test region is not affected by a primary electron beam for the other test region during testing.

Referring back to FIG. 4, test image analyzer 420 is configured to determine whether test image 501 is distorted and to measure the distortion amount. According to embodiments of the present disclosure, test image analyzer 420 can analyze test images by referring to reference images corresponding to the test images. According to embodiments of the present disclosure, information file 440 can contain reference images corresponding to test images. Information file 440 may be any means of storing information, such as a file, a set of files, a database, a set of databases, etc. Information file 440 can, for example, include reference images of test regions for the test images. In some embodiments, a reference image contained in information file 440 can be a ground truth image of a corresponding test region. A ground truth image can include a raw image of a wafer or die containing the corresponding pattern or can include a ground truth wafer map measured from a wafer or die containing the corresponding pattern, among others. In some embodiments, a reference image contained in information file 440 can be in Graphic Database System (GDS) format, Graphic Database System II (GDS II) format, an Open Artwork System Interchange Standard (OASIS) format, a Caltech Intermediate Format (CIF), etc. In some embodiments, a reference image contained in information file 440 can comprise a wafer design layout of a corresponding test region. The wafer design layout may be based on a pattern layout for constructing the wafer. The wafer design layout may correspond to one or more photolithography masks or reticles used to transfer features from the photolithography masks or reticles to a wafer. In some embodiments, a reference image in GDS or OASIS, among others, may comprise feature information stored in a binary file format representing planar geometric shapes, text, and other information related to wafer design layout.

For illustration and simplicity purposes, operations of test image analyzer 420 will be explained under the assumption that inspection images 300, 310, and 320 of FIG. 3A to FIG. 3C are test images. With respect to FIG. 3A, it is assumed that positions 301 are feature positions on a first test image 300 and reference positions 302 are corresponding feature positions on a first reference image corresponding to first test image 300. As shown in FIG. 3A, positions 301 of features on first test image 300 match corresponding reference positions 302 of features. In this example, test image analyzer 420 can determine that first test image 300 is not distorted.

With respect to FIG. 3B, it is assumed that positions 311 are feature positions on a second test image 310 and reference positions 302 are corresponding feature positions on a second reference image corresponding to second test image 310. As shown in FIG. 3B, positions 311 of features on second test image 310 do not match corresponding reference positions 302 of features and thus test image analyzer 420 can determine that second test image 310 is distorted. In some embodiments, based on a comparison of feature distances on second test image 310 and a second reference image, test image analyzer 420 can determine whether second test image 310 has expanded or shrunk For example, test image analyzer 420 can compare a first distance $d_1$ between two feature positions 311 on second test image 310 with a second distance $d_2$ between two reference feature positions 302 on a second reference image corresponding to the two feature positions 311. In this example, since first distance $d_1$ is greater than second distance $d_2$, test image analyzer 420 can determine that second test image 310 has expanded.

In some embodiments, based on a distance between a feature position 311 on second test image 310 and a reference feature position 302 corresponding to the feature, test image analyzer 420 can determine a distortion amount. As shown in FIG. 3B, a distortion amount can be determined based on a third distance $d_3$ between centers of a feature position 311 on second test image 310 and a corresponding reference feature position 302. In some embodiments, because an absolute distortion amount can vary depending on feature position 311 on second test image 310 as shown in FIG. 3B, a distortion amount (e.g., $d_3$) of a feature position 321 at a criteria location (e.g., a certain distance from a center) of second test image 310 can be used as a distortion amount. In some embodiments, if a feature does not exist at a criteria location, a distortion amount can be estimated based on measured distortion amounts of feature positions 311 in the second test image 310. Thereby, an adequate comparison between distortion amounts of multiple test images can be obtained. In some embodiments, a distortion amount for second test image 310 can be determined based on an average of displacement amounts (e.g., third distance $d_3$) for multiple features in the second test image 310. In this example, test image analyzer 420 can determine that second test image 310 is distorted (e.g., expanded) and that a distortion amount corresponds to a third distance $d_3$ or average of displacements amounts for features in the second test image 310.

With respect to FIG. 3C, it is assumed that positions 321 are feature positions on a third test image 320 and reference positions 302 are corresponding feature positions on a third reference image corresponding to third test image 320. As shown in FIG. 3C, positions 321 of features on third test image 320 do not match corresponding reference positions 302 of features and thus test image analyzer 420 can determine that third test image 320 is distorted. In some embodiments, based on a comparison of feature distances on third test image 320 and a third reference image, test image analyzer 420 can determine whether third test image 320 has expanded or shrunk For example, test image analyzer 420 can compare a first distance $d_1$ between two feature positions 321 on third test image 320 with a second distance $d_2$ between two reference feature positions 302 on a third reference image corresponding to the two feature positions 321. In this example, since first distance $d_1$ is smaller than second distance $d_2$, test image analyzer 420 can determine that third test image 320 has contracted.

In some embodiments, based on a distance between a feature position 321 on third test image 320 and a reference feature position 302 corresponding to the feature, test image analyzer 420 can determine a distortion amount. As shown in FIG. 3C, a distortion amount can be determined based on a third distance $d_3$ between centers of a feature position 321 on third test image 320 and a corresponding reference feature position 302. In some embodiments, because an absolute distortion amount can vary depending on feature position 321 on third test image 320 as shown in FIG. 3C, a distortion amount (e.g., $d_3$) of feature position 321 at a criteria location (e.g., a certain distance from a center) of third test image 320 can be used as a distortion amount. In some embodiments, if a feature does not exist at a criteria location, a distortion amount can be estimated based on measured distortion amounts of feature positions 321 in third test image 320. Thereby, an adequate comparison between distortions amounts of multiple test images can be obtained. In some embodiments, a distortion amount for third test image 320 can be determined based on an average of displacement amounts (e.g., third distance $d_3$) for multiple features in the third test image 320. In this example, test image analyzer 420 can determine that third test image 320 is distorted (e.g., contracted) and that a distortion amount corresponds to a third distance $d_3$ or average of displacements amounts for features in the third test image 320.

Figure 6:
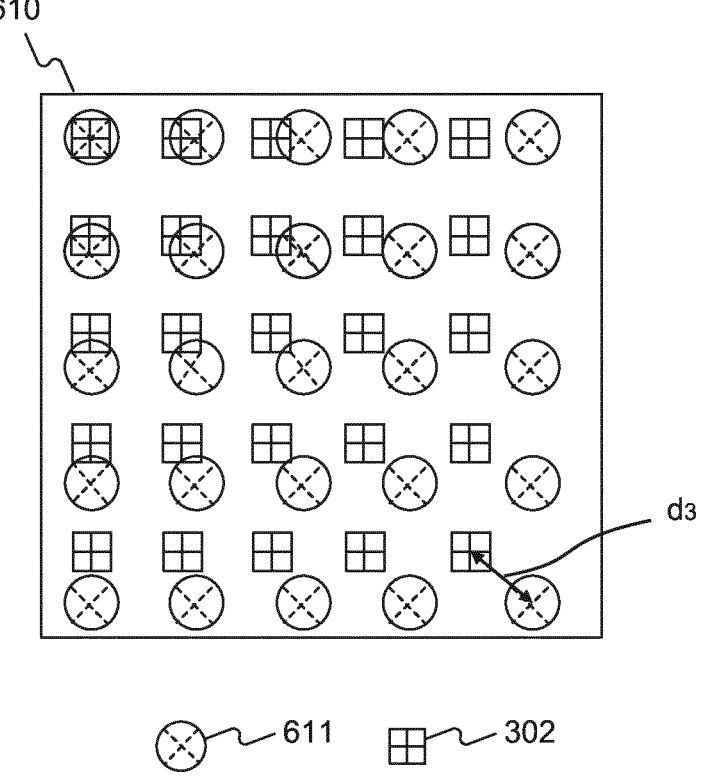
FIG. 6 illustrates an example method of measuring a distortion amount, consistent with embodiments of the present disclosure.

While determining a distortion level of a test image (e.g., 300, 310, or 320 of FIGS. 3A to 3C) has been explained by aligning a test image with a reference image such that centers of the test image and the reference image match, it will be appreciated that any method for determining a distortion level can be applied to embodiments of the present disclosure. FIG. 6 illustrates an example method of measuring a distortion level, consistent with embodiments of the present disclosure. As shown in FIG. 6, a distortion amount can be analyzed and determined by aligning a test image 610 and a corresponding reference image such that a feature position 611 on test image 610 at one corner (e.g., top-left corner) matches a corresponding feature position 302 on the reference image. In this example, a distortion amount can be determined based on a third distance $d_3$ between centers of a feature position 611 on test image 610 located at another corner (e.g., a diagonally opposite corner to the one corner; bottom-right corner in FIG. 6) and a corresponding reference feature position 302. Although FIG. 6 illustrates the example method of measuring a distortion level of test image 610 taken under a negative charge condition, it is noted that the same method can be applied to measure a distortion level of a test image taken under a positive charge condition or a neutral charge condition.

Figure 7:
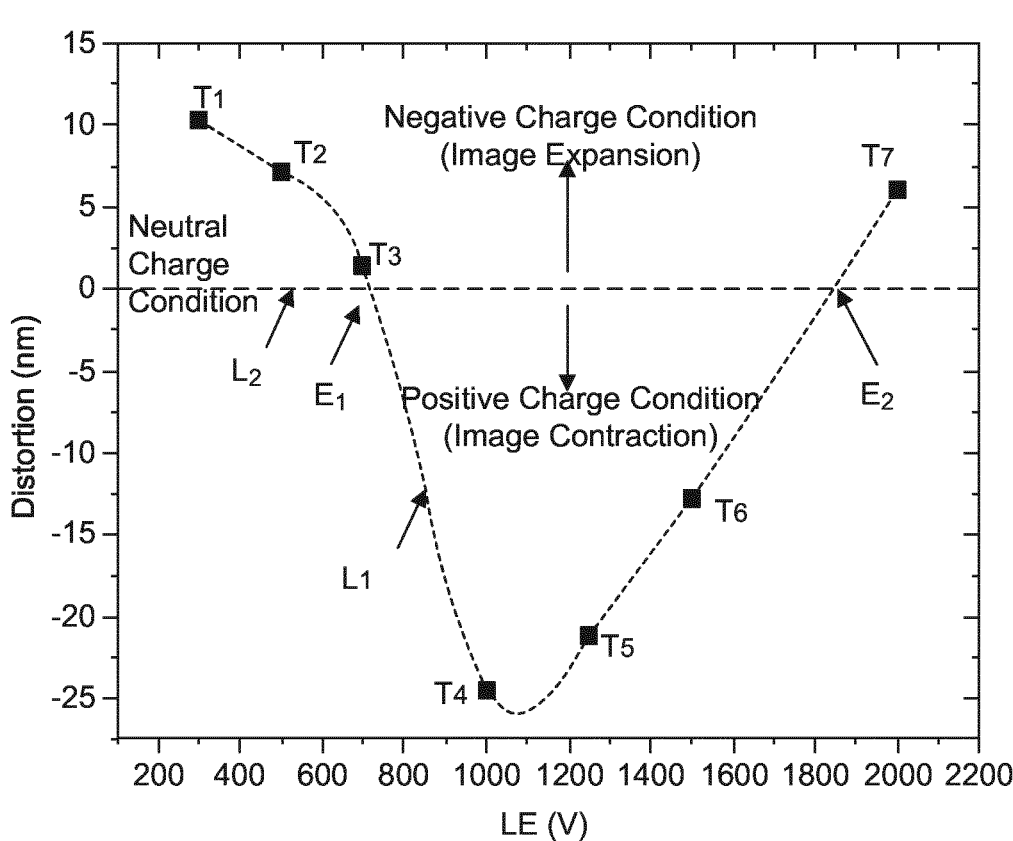
FIG. 7 is an example graph for identifying a landing energy corresponding to a neutral charge condition, consistent with embodiments of the present disclosure.

As discussed above, test image analyzer 420 is configured to analyze a plurality of test images that are acquired by test image acquirer 410. According to embodiments of the present disclosure, based on the determined distortion tendency (e.g., expansion or contraction) and distortion amount (e.g., displacement amount), test image analyzer 420 is configured to determine a landing energy that enables a sample to be in a neutral charge condition during inspection. FIG. 7 is an example graph 700 for identifying a landing energy corresponding to a neutral charge condition, consistent with embodiments of the present disclosure. In FIG. 7, a landing energy is indicated with a voltage V that is applied to primary electron beams, e.g., in order to accelerate or decelerate the electron beams during a test. Because an electron has a constant charge value, the voltage applied to the electron can be an indication of the electron's energy when the electron lands on the sample.

As shown in FIG. 7, test results $T_1$ to $T_7$ are indicated in the graph 700. In this example, test results $T_1$ to $T_7$ can be distortion amounts determined by test image analyzer 420 from seven test images (e.g., test image 310 or 320 of FIG. 3B or 3C). For example, a first, second, third, and seventh test results $T_1$, $T_2$, $T_3$, and $T_7$ can be obtained from four test images similar to second test image 310 of FIG. 3B in that the test results $T_1$, $T_2$, $T_3$, and $T_7$ indicate image expansion Similarly, a fourth, fifth, and sixth test results $T_4$, $T_5$, and $T_6$ can be obtained from three test images similar to third test image 320 of FIG. 3C in that the test results $T_4$, $T_5$, and $T_6$ indicate image contraction. As shown in FIG. 7, each test result $T_1$ to $T_7$ is positioned in the graph 700 according to its corresponding landing energy and distortion amount. For example, first test result $T_1$ represents a distortion amount of a test image that is taken with a landing energy of 300V. Similarly, second to seventh test results $T_2$ to $T_7$ are indicated in the graph 700. In some embodiments, when test results $T_1$ to $T_7$ are obtained from test images for different test regions, the distortion amounts for each test results $T_1$ to $T_7$ on graph 700 can be normalized values or distortion amounts at a criteria location in order for fair comparison among test results $T_1$ to $T_7$. While FIG. 7 illustrates 7 test results, it will be appreciated that any number of test results can be applied to embodiments of the present disclosure.

It may not be possible to get a test image (e.g., first test image 300 of FIG. 3A) that is not distorted. According to embodiments of the present disclosure, test image analyzer 420 is configured to determine a landing energy (aka, a neutral landing energy in this disclosure) enabling a sample to be in a neutral charge condition during inspection based on test results (e.g., $T_1$ to $T_7$). In some embodiments, test image analyzer 420 can estimate a neutral landing energy by interpolation a curve of test results (e.g., $T_1$ to $T_7$) on graph 700. For example, an interpolation line $L_1$ connecting test results $T_1$ to $T_7$ can be defined as shown in FIG. 7 and a neutral landing energy $E_1$ or $E_2$ can be obtained at an intersection between interpolation line $L_1$ and a neutral charge condition line $L_2$, which is a horizontal line indicating a zero displacement. In this example, two landing energies $E_1$ and $E_2$ are estimated as neutral landing energies for the sample.

Referring back to FIG. 4, inspection condition controller 430 is configured to set an inspection condition for inspecting the sample according to the determination of test image analyzer 420, consistent with embodiments of the present disclosure. According to embodiments of the present disclosure, an inspection condition can include a landing energy of a primary electron beam for inspecting the sample. A neutral landing energy (e.g., $E_1$ or $E_2$) can be a material or property specific parameter and therefore a neutral landing energy determined from some portion (e.g., test region) of a sample can be used to inspect a whole sample. In some embodiments, a neutral landing energy determined for a sample having a certain material can also be used to inspect another sample having the same material. In some embodiments, inspection condition controller 430 can set a landing energy for inspecting the sample to a neutral landing energy $E_1$ or $E_2$ determined by test image analyzer 420, which enables avoiding charge accumulation on a sample.

In some embodiments, setting a landing energy to a neutral landing energy $E_1$ or $E_2$ may not be allowed, for example, due to inspection requirements, restraints, etc. For example, a landing energy may not be set greater than a certain level because a sample may start getting damaged from an electron beam current with a higher level of energy. A landing energy may not be set smaller than a certain level because secondary electron beams may not be adequately emitted with a lower level of energy. Or a landing energy may not be set smaller than a certain level in order to get an inspection image having a desired resolution. Therefore, in some embodiments, a landing energy for inspecting a sample can be set as close as to a neutral landing energy $E_1$ or $E_2$. And inspection condition controller 430 can further perform an inspection tool calibration to suppress or compensate charging on a sample during inspection in addition to controlling a landing energy of a primary electron beam. For example, other inspection conditions such as a primary beam current dose on a sample can be also adjusted.

According to embodiments of the present disclosure, inspection image acquirer 450 can acquire an inspection image of the sample. An inspection image can be acquired by using the landing energy set by inspection condition controller 430. In some embodiments, inspection image acquirer 450 may generate an inspection image of the sample based on a detection signal from electron detection device 140 of electron beam tool 40. In some embodiments, inspection image acquirer 450 may be part of or may be separate from an image acquirer included in controller 50. In some embodiments, inspection image acquirer 450 may obtain the inspection image generated by an image acquirer included in controller 50. In some embodiments, inspection image acquirer 450 may obtain the inspection image from a storage device or system storing the inspection image.

As discussed above, setting a landing energy to a neutral landing energy $E_1$ or $E_2$ may not be allowed, for example, due to inspection requirements, restraints, etc, or the estimated neutral landing energy $E_1$ or $E_2$ may not be accurate. Therefore, charge can still accumulate on a sample during inspection with a landing energy set by inspection condition controller 430 and the inspection image taken therefrom can still have distortion.

According to embodiments of the present disclosure, image enhancement apparatus 400 can further comprise an image corrector 460 as shown in FIG. 4. Image corrector 460 can be configured to perform image correction to compensate charge accumulation effects. In some embodiments, image corrector 460 can correct an inspection image by referring to a reference image corresponding to an inspection image of a sample. For example, image corrector 460 can compare the reference image contained in information file 440 with an inspection image acquired by inspection image acquirer 450 and correct errors on the inspection image. In some embodiments, a reference image can be an image for a whole sample.

In some other embodiments, image corrector 460 can correct an inspection image by applying a predetermined offset to the inspection image. A predetermined offset can be obtained from multiple experiments. In some embodiments, multiple experimental inspection images can be taken with the landing energy set by inspection condition controller 430 and an error amount (e.g., distortion amount or displacement amount) for each experimental inspection image can be determined, e.g., by comparison with a reference image. An offset can be determined based on an average of error amounts for multiple experimental inspection. In some embodiments, to reduce a processing time and resource, each experimental inspection image can be obtained for a small portion of a sample. In some embodiments, multiple experimental inspection images can be taken at the same time similar to test images. In some embodiments, a plurality of test regions for testing can be also used for multiple experimental inspection images.

According to embodiments of the present disclosure, operations of image enhancement apparatus 400 can be automated. According to embodiments of the present disclosure, e.g., when image processing time and resource for test image analysis or experimental inspection image analysis is sufficiently small, identifying a neutral landing energy for a sample, inspecting a sample with a landing energy based on the neutral landing energy, and correcting an inspection image taken therefrom can be performed in real time.

Figure 8:
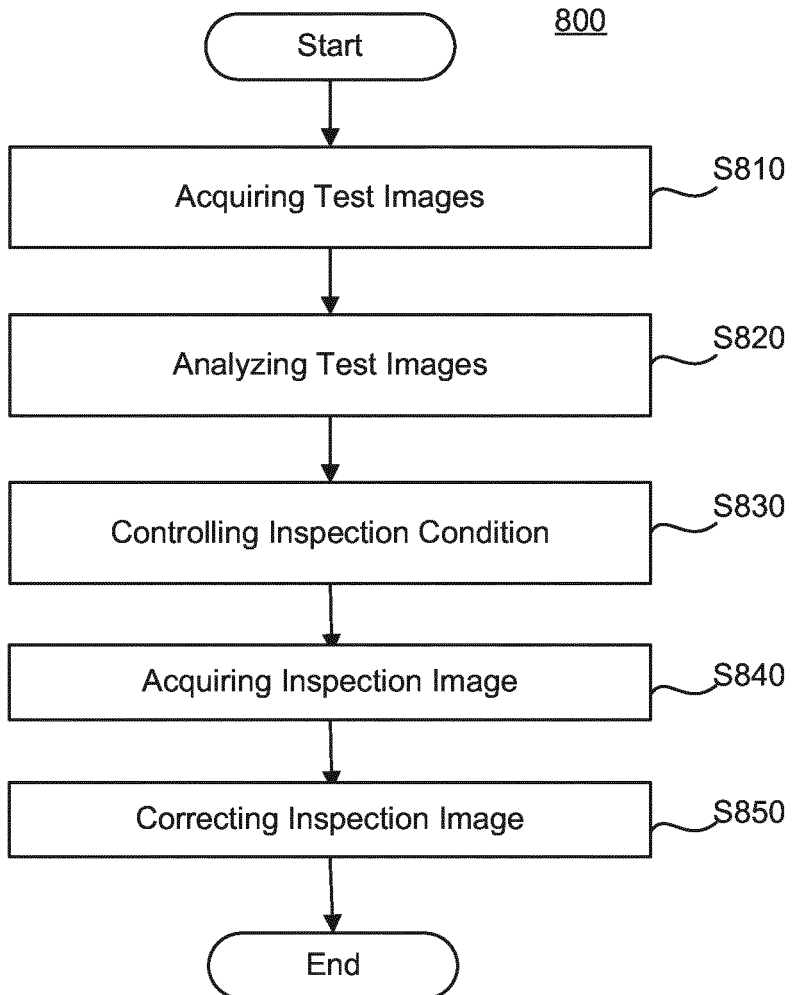
FIG. 8 is a process flowchart representing an example method for enhancing an image in a multi-beam inspection system, consistent with embodiments of the present disclosure.

FIG. 8 is a process flowchart representing an example method for enhancing an image in a multi-beam inspection system, consistent with embodiments of the present disclosure. For illustrative purposes, a method for enhancing an image will be described referring to image enhancing apparatus 400 of FIG. 4.

In step 5810, a plurality of test images (e.g., 300, 310, or 320 of FIGS. 3A-3C) can be obtained. Step 5810 can be performed by, for example, test image acquirer 410, among others. A test image can be an inspection image for a region of a sample. A plurality of test images can be taken at different landing energies. In some embodiments, a plurality of test images can be taken for different test regions of a sample at the same time, such as via a multi-beam SEM. In this case, testing regions for the plurality of test images can be spaced apart such that one test region is not affected by an electron beam for other test region during testing. In some other embodiments, a plurality of test images can be taken for a region of a sample at different times sequentially. In some embodiments, to reduce a processing time and resource, a test image can be obtained for a small portion of a sample.

According to embodiments of the present disclosure, a test region on a sample can be chosen such that an image distortion (e.g., image expansion or image contraction) is measured from its corresponding test image. FIG. 5 illustrates an example of a test region 501 on a sample 500, consistent with embodiments of the present disclosure. As shown in FIG. 5, test region 501 can comprise multiple features 502 therein, and a center 503 of test region 501 is also indicated for an illustration purpose. While FIG. 5 illustrates regularly arranged features 502, it will be appreciated that features 502 included in test region 501 may not be regularly arranged Similarly, features 502 included in test region 501 can have different shapes even though FIG. 5 illustrates features 502 having the same shape. In some embodiments, an area of test region 501 can correspond to a field of view of a primary electron beam (e.g., beamlets 102_1, 102_2, or 102_3). Choosing a region having multiple features 502 as test region 501 is one of several ways to enable measuring image distortion (e.g., image expansion or image extraction) of a test image based on feature displacements. In some embodiments, a sample can include an area that is designed or designated to be a test region and that includes multiple features 502, which is advantageous in determining a distortion level of a test image therefrom.

When a plurality of test images are taken for different test regions of sample 500, a plurality of test regions on different portions of sample 500 can be chosen for the plurality of test images. Similarly, each of the plurality of test regions can have multiple features (e.g., 502). In some embodiments, a sample can include a plurality of areas that are designed to be test regions and that include multiple features 502 having the same shape as each other, which is advantageous in comparing distortion levels of test images therefrom. In some embodiments, the plurality of areas can include a feature at the same relative position in each area. In some embodiments, choosing a plurality of test regions having similar patterns or features can be advantageous in comparing displacement measurements from a plurality of test images corresponding to the plurality of test regions.

In step S820, acquired test images are analyzed. Step S820 can be performed by, for example, test image analyzer 420, among others. In step S820, a distortion level (e.g., distortion tendency, distortion amount, etc.) can be determined. According to embodiments of the present disclosure, test images can be analyzed by referring to reference images corresponding to the test images. In some embodiments, a reference image can be a ground truth image of a corresponding test region. A ground truth image can include a raw image of a wafer or die containing the corresponding pattern or can include a ground truth wafer map measured from a wafer or die containing the corresponding pattern, among others. In some embodiments, a reference image can be in Graphic Database System (GDS) format, Graphic Database System II (GDS II) format, an Open Artwork System Interchange Standard (OASIS) format, a Caltech Intermediate Format (CIF), etc. In some embodiments, a reference image can comprise a wafer design layout of a corresponding test region. The wafer design layout may be based on a pattern layout for constructing the wafer. The wafer design layout may correspond to one or more photolithography masks or reticles used to transfer features from the photolithography masks or reticles to a wafer. In some embodiments, a reference image in GDS or OASIS, among others, may comprise feature information stored in a binary file format representing planar geometric shapes, text, and other information related to wafer design layout.

For illustration and simplicity purposes, step S820 will be explained under the assumption that inspection images 300, 310, and 320 of FIG. 3A to FIG. 3C are test images. As shown in FIG. 3A, positions 301 of features on first test image 300 correspond to reference positions 302 of features. In this example, it will be determined that first test image 300 is not distorted.

As shown in FIG. 3B, positions 311 of features on second test image 310 do not match corresponding reference positions 302 of features and thus it will be determined that second test image 310 is distorted. In some embodiments, based on a comparison of feature distances on second test image 310 and a second reference image, whether second test image 310 has expanded or shrunk is determined. For example, a first distance $d_1$ between two feature positions 311 on second test image 310 can be compared with a second distance $d_2$ between two reference feature positions 302 on a second reference image corresponding to the two feature positions 311. In this example, since first distance $d_1$ is greater than second distance $d_2$, it will be determined that second test image 310 has expanded.

In some embodiments, based on a distance between a feature position 311 on second test image 310 and a reference feature position 302 corresponding to the feature, a distortion amount can be determined. As shown in FIG. 3B, a distortion amount can be determined based on a third distance $d_3$ between centers of a feature position 311 on second test image 310 and a corresponding reference feature position 302. In some embodiments, because an absolute distortion amount can vary depending on feature position 311 on second test image 310 as shown in FIG. 3B, a distortion amount (e.g., $d_3$) of a feature position 321 at a criteria location (e.g., a certain distance from a center) of second test image 310 can be used as a distortion amount. In some embodiments, if a feature does not exist at a criteria location, a distortion amount can be estimated based on measured distortion amounts of feature positions 311 in the second test image 310. Thereby, an adequate comparison between distortion amounts of multiple test images can be obtained. In some embodiments, a distortion amount for second test image 310 can be determined based on an average of displacement amounts (e.g., third distance $d_3$) for multiple features in the second test image 310. In this example, it will be determined that second test image 310 is distorted (e.g., expanded) and that a distortion amount corresponds to a third distance $d_3$ or average of displacements amounts for features in the second test image 310.

As shown in FIG. 3C, positions 321 of features on third test image 320 do not match corresponding reference positions 302 of features and thus it will be determined that third test image 320 is distorted. In some embodiments, based on a comparison of feature distances on third test image 320 and a third reference image, whether third test image 320 has expanded or shrunk is determined. For example, a first distance $d_1$ between two feature positions 321 on third test image 320 can be compared with a second distance $d_2$ between two reference feature positions 302 on a third reference image corresponding to the two feature positions 321. In this example, since first distance $d_1$ is smaller than second distance $d_2$, it will be determined that third test image 320 has contracted.

In some embodiments, based on a distance between a feature position 321 on third test image 320 and a reference feature position 302 corresponding to the feature, a distortion amount can be determined. As shown in FIG. 3C, a distortion amount can be determined based on a third distance $d_3$ between centers of a feature position 321 on third test image 320 and a corresponding reference feature position 302. In some embodiments, because an absolute distortion amount can vary depending on feature position 321 on third test image 320 as shown in FIG. 3C, a distortion amount (e.g., $d_3$) of feature position 321 at a criteria location (e.g., a certain distance from a center) of third test image 320 can be used as a distortion amount. In some embodiments, if a feature does not exist at a criteria location, a distortion amount can be estimated based on measured distortion amounts of feature positions 321 in third test image 320. Thereby, an adequate comparison between distortion amounts of multiple test images can be obtained. In some embodiments, a distortion amount for third test image 320 can be determined based on an average of displacement amounts (e.g., third distance $d_3$) for multiple features in the second test image 320. In this example, it will be determined that third test image 320 is distorted (e.g., contracted) and that a distortion amount corresponds to a third distance $d_3$ or average of displacements amounts for features in the third test image 320.

While determining a distortion level of a test image (e.g., 300, 310, and 320 of FIGS. 3A to 3C) has been explained by aligning a test image with a reference image such that centers of the test image and the reference image match, it will be appreciated that any method for determining a distortion level can be applied to embodiments of the present disclosure. FIG. 6 illustrates an example method of measuring a distortion level, consistent with embodiments of the present disclosure. As shown in FIG. 6, a distortion amount can be analyzed and determined by aligning a test image 610 and a corresponding reference image such that a feature position 611 on test image 610 at one corner (e.g., top-left corner) matches a corresponding feature position 302 on the reference image. In this example, a distortion amount can be determined based on a third distance $d_3$ between centers of a feature position 611 on test image 610 located at another corner (e.g., a diagonally opposite corner to the one corner; bottom-right corner in FIG. 6) and a corresponding reference feature position 302. Although FIG. 6 illustrates the example method of measuring a distortion level of test image 610 taken under a negative charge condition, it is noted that the same method can be applied to measure a distortion level of a test image taken under a positive charge condition or a neutral charge condition.

FIG. 7 is an example graph 700 for identifying a landing energy corresponding to a neutral charge condition, consistent with embodiments of the present disclosure. In FIG. 7, a landing energy is indicated with a voltage V that is applied to primary electron beams, e.g., in order to accelerate or decelerate the electron beams during a test. Because an electron has a constant charge value, the voltage applied to the electron can be an indication of the electron's energy when the electron lands on the sample.

As shown in FIG. 7, test results $T_1$ to $T_7$ are indicated in the graph 700. In this example, test results $T_1$ to $T_7$ can be distortion amounts. As shown in FIG. 7, each test result $T_1$ to $T_7$ is positioned in the graph 700 according to its corresponding landing energy and distortion amount. In some embodiments, when test results $T_1$ to $T_7$ are obtained from test images for different test regions, the distortion amounts for each test results $T_1$ to $T_7$ on graph 700 can be normalized values or distortion amounts at a criteria location in order for fair comparison among test results $T_1$ to $T_7$. According to embodiments of the present disclosure, in step S820, a landing energy (aka, a neutral landing energy in this disclosure) enabling a sample to be in a neutral charge condition during inspection can be determined based on test results (e.g., $T_1$ to $T_7$). In some embodiments, a neutral landing energy can be estimated by interpolation a curve of test results (e.g., $T_1$ to $T_7$) on graph 700. For example, an interpolation line $L_1$ connecting test results $T_1$ to $T_7$ can be defined as shown in FIG. 7 and a neutral landing energy $E_1$ or $E_2$ can be obtained at an intersection between interpolation line $L_1$ and a neutral charge condition line $L_2$, which is a horizontal line indicating a zero displacement. In this example, two landing energies $E_1$ and $E_2$ are estimated as neutral landing energies for the sample.

Referring back to FIG. 8, in step S830, an inspection condition for inspecting the sample can be controlled according to the analysis in step S820. Step S830 can be performed by, for example, inspection condition controller 430, among others. According to embodiments of the present disclosure, an inspection condition can include a landing energy of a primary electron beam for inspecting the sample. A neutral landing energy (e.g., $E_1$ and $E_2$) can be material or property specific parameter, and therefore a neutral landing energy determined from some portions (e.g., test region) of a sample can be used to inspect a whole sample. In some embodiments, a neutral landing energy determined for a sample having a certain material can also be used to inspect another sample having the same material. In some embodiments, a landing energy for inspecting the sample can be set to a neutral landing energy $E_1$ or $E_2$ determined in step S820, which enables avoiding charge accumulation on a sample.

In some embodiments, setting a landing energy to a neutral landing energy $E_1$ or $E_2$ may not be allowed, for example, due to inspection requirements, restraints, etc. Therefore, in some embodiments, a landing energy for inspecting a sample can be set as close as to a neutral landing energy $E_1$ or $E_2$. And an inspection tool calibration can be further performed to suppress or compensate charging on a sample during inspection in addition to controlling a landing energy of a primary electron beam. For example, other inspection conditions such as a primary beam current dose on a sample can also be adjusted.

In step 5840, an inspection image of the sample can be acquired. Step S8740 can be performed by, for example, inspection image acquirer 420, among others. Inspection image can be acquired by using the landing energy set in step S830.

As discussed above, setting a landing energy to a neutral landing energy $E_1$ or $E_2$ may not be allowed, for example, due to inspection requirements, restraints, etc, or the estimated neutral landing energy $E_1$ or $E_2$ may not be accurate. Therefore, charge can still accumulate on a sample during inspection with a landing energy set in step S830 and the inspection image taken therefrom can still have distortion.

According to embodiments of the present disclosure, the method can further comprise step S850. In step S850, image correction can be performed to compensate charge accumulation effects. In some embodiments, an inspection image can be corrected by referring to a reference image corresponding to an inspection image of a sample. For example, the reference image can be compared with an inspection image acquired in step S840, and errors on the inspection image can be corrected based on the comparison. Here, a reference image can be an image for a whole sample.

In some embodiments, an inspection image can be corrected by applying a predetermined offset to the inspection image. A predetermined offset can be obtained from multiple experiments. In some embodiments, multiple experimental inspection images can be taken with the landing energy set in step 5830 and an error amount (e.g., distortion amount or displacement amount) for each experimental inspection image can be determined, e.g., by comparison with a reference image. An offset can be determined based on an average of error amounts for multiple experimental inspection. In some embodiments, to reduce a processing time and resource, each experimental inspection image can be obtained for a small portion of a sample.

Aspects of the present disclosure are set out in the following numbered clauses:

1. A method for enhancing an inspection image in a charged-particle beam inspection system, the method comprising:
acquiring a plurality of test images of a sample that are obtained at different landing energies;
determining distortion levels for the plurality of test images;
determining a landing energy level that enables the sample to be in a neutral charge condition during inspection based on the distortion levels; and
acquiring an inspection image based on the determined landing energy level.

2. The method of clause 1, further comprising:
correcting the inspection image based on a reference image corresponding to the inspection image.

3. The method of clause 1 or 2, wherein each of the acquired plurality of test images of the sample corresponds to a test region of a plurality of test regions of the sample.

4. The method of any one of clauses 1-3, wherein determining distortion levels for the plurality of test images comprises determining a first distortion level for a first test image among the plurality of test images based on a first reference image corresponding to the first test image.

5. The method of clause 4, wherein the first distortion level comprises information that indicates whether the first test image expands or contracts.

6. The method of clause 4, wherein the first distortion level comprises a first distortion amount based on a displacement between a feature on the first test image and a corresponding feature on the first reference image.

7. The method of any one of clauses 1-6, wherein determining a landing energy level enabling the sample to be in a neutral charge condition comprises estimating the landing energy level enabling a distortion amount to be zero based on the distortion levels.

8. The method of clause 4, wherein the determination of the first distortion level is based on a comparison between a first distance of two features on the first test image and a second distance of corresponding two features on the first reference image.

9. The method of clause 3, wherein each of the plurality of test regions comprises multiple features.

10. The method of clause 1, further comprising correcting the inspection image by applying a predetermined offset to the inspection image.

11. The method of clause 10, wherein the predetermined offset is determined based on an error amount of an experimental inspection image corresponding to a portion of the sample acquired based on the determined landing energy level.

12. An image enhancing apparatus comprising:
a memory storing a set of instructions; and
at least one processor configured to execute the set of instructions to cause the apparatus to perform:
acquiring a plurality of test images of a sample that are obtained at different landing energies;
determining distortion levels for the plurality of test images;
determining a landing energy level that enables the sample to be in a neutral charge condition during inspection based on the distortion levels; and
acquiring an inspection image based on the determined landing energy level.

13. The apparatus of clause 12, wherein the at least one processor is configured to execute the set of instructions to cause the apparatus to further perform:
correcting the inspection image based on a reference image corresponding to the inspection image.

14. The apparatus of clause 12 or 13, wherein each of the acquired plurality of test images of the sample corresponds to a test region of a plurality of test regions of the sample.

15. The apparatus of any one of clauses 12-14, wherein determining distortion levels for the plurality of test images comprises determining a first distortion level for a first test image among the plurality of test images based on a first reference image corresponding to the first test image.

16. The apparatus of clause 15, wherein the first distortion level comprises information that indicates whether the first test image expands or contracts.

17. The apparatus of clause 15, wherein the first distortion level comprises a first distortion amount based on a displacement between a feature on the first test image and a corresponding feature on the first reference image.

18. The apparatus of any one of clauses 13-17, wherein determining a landing energy level enabling the sample to be in a neutral charge condition comprises estimating the landing energy level enabling a distortion amount to be zero based on the distortion levels.

19. A non-transitory computer readable medium that stores a set of instructions that is executable by at least one processor of a computing device to perform a method for enhancing an image, the method comprising:

acquiring a plurality of test images of a sample that are obtained at different landing energies;

determining distortion levels for the plurality of test images;

determining a landing energy level that enables the sample to be in a neutral charge condition during inspection based on the distortion levels; and acquiring an inspection image based on the determined landing energy level.

20. The computer readable medium of clause 19, wherein the set of instructions that is executable by at least one processor of the computing device to further perform:

correcting the inspection image based on a reference image corresponding to the inspection image.

21. The computer readable medium of clause 19 or 20, wherein each of the acquired plurality of test images of the sample corresponds to a test region of a plurality of test regions of the sample.

22. The computer readable medium of any one of clauses 19-21, wherein determining distortion levels for the plurality of test images comprises determining a first distortion level for a first test image among the plurality of test images based on a first reference image corresponding to the first test image.

23. The computer readable medium of clause 22, wherein the first distortion level comprises information that indicates whether the first test image expands or contracts.

24. The computer readable medium of clause 22, wherein the first distortion level comprises a first distortion amount based on a displacement between a feature on the first test image and a corresponding feature on the first reference image.

25. The computer readable medium of any one of clauses 19-24, wherein determining a landing energy level enabling the sample to be in a neutral charge condition comprises estimating the landing energy level enabling a distortion amount to be zero based on the distortion levels.

26. A method for identifying an optimum landing energy in a charged-particle beam inspection system, the method comprising:

acquiring a plurality of test images of a sample that are obtained at different landing energies;

determining distortion levels for the plurality of test images, wherein determining distortion levels comprises comparing a first test image with a first reference image corresponding to the first test image based on positions of features in the first test image and the first reference image; and determining a landing energy level that enables the sample to be in a neutral charge condition during inspection based on the distortion levels.

27. The method of clause 26, further comprising:

correcting an inspection image that is obtained based on the determined landing energy level based on a reference image corresponding to the inspection image.

28. The method of clause 26, further comprising correcting the inspection image by applying a predetermined offset to the inspection image.

29. The method of any one of clauses 26-28, wherein each of the acquired plurality of test images of the sample corresponds to a test region of a plurality of test regions of the sample.

30. A method for enhancing an inspection image in a charged-particle beam inspection system, the method comprising:

acquiring a first test image and a second test image of a sample, wherein the first test image and the second test image are obtained at different landing energies;

determining a first distortion level for the first test image and a second distortion level for the second test image;

determining a landing energy level that enables a distortion level to be substantially zero when inspecting the sample, the determination of the landing energy level being based on the first distortion level, the second distortion level, and the different landing energies; and acquiring an inspection image based on the determined landing energy level.

31. The method of clause 30, wherein the determination of the landing energy level includes performing an interpolation based on the first distortion level, the second distortion level, and the different landing energies.

32. The method of clause 30 or 31, further comprising:

correcting the inspection image based on a reference image corresponding to the inspection image.

33. The method of clause 30 or 31, further comprising correcting the inspection image by applying a predetermined offset to the inspection image.

A non-transitory computer readable medium may be provided that stores instructions for a processor of a controller (e.g., controller 50 of FIG. 1) to carry out, among other things, image inspection, image acquisition, stage positioning, beam focusing, electric field adjustment, beam bending, condenser lens adjusting, activating charged-particle source, beam deflecting, and method 800. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A method for enhancing an inspection image in a charged-particle beam inspection system, the method comprising:
    acquiring a plurality of test images of a sample that are obtained at different landing energies;
    analyzing the acquired plurality of test images, wherein the analyzing comprises:
        determining distortion levels for the plurality of test images, wherein a distortion amount for each test image of the plurality of test images is determined; and
        comparing among the determined distortion amounts of the plurality of test images;
    determining a landing energy level that enables the sample to be in a neutral charge condition during inspection based on the distortion levels; and
    acquiring an inspection image based on the determined landing energy level.

2. The method of claim 1, further comprising: correcting the inspection image based on a reference image corresponding to the inspection image.

3. The method of claim 1, wherein each of the acquired plurality of test images of the sample corresponds to a test region of a plurality of test regions of the sample.

4. The method of claim 1, wherein determining distortion levels for the plurality of test images comprises determining a first distortion level for a first test image among the plurality of test images based on a first reference image corresponding to the first test image.

5. The method of claim 4, wherein the first distortion level comprises information that indicates whether the first test image expands or contracts.

6. The method of claim 4, wherein the first distortion level comprises a first distortion amount based on a displacement between a feature on the first test image and a corresponding feature on the first reference image.

7. An image enhancing apparatus comprising:
    a memory storing a set of instructions; and
    at least one processor configured to execute the set of instructions to cause the image enhancing apparatus to perform:
        acquiring a plurality of test images of a sample that are obtained at different landing energies;
        analyzing the acquired plurality of test images, wherein the analyzing comprises:
            determining distortion levels for the plurality of test images, wherein a distortion amount for each test image of the plurality of test images is determined; and
            comparing among the determined distortion amounts of the plurality of test images;
        determining a landing energy level that enables the sample to be in a neutral charge condition during inspection based on the distortion levels; and acquiring an inspection image based on the determined landing energy level.

8. The image enhancing apparatus of claim 7, wherein the at least one processor is configured to execute the set of instructions to cause the apparatus to further perform:
    correcting the inspection image based on a reference image corresponding to the inspection image.

9. The image enhancing apparatus of claim 8, wherein determining a landing energy level enabling the sample to be in a neutral charge condition comprises estimating the landing energy level enabling a distortion amount to be zero based on the distortion levels.

10. The image enhancing apparatus of claim 7, wherein each of the acquired plurality of test images of the sample corresponds to a test region of a plurality of test regions of the sample.

11. The image enhancing apparatus of claim 7, wherein determining distortion levels for the plurality of test images comprises determining a first distortion level for a first test image among the plurality of test images based on a first reference image corresponding to the first test image.

12. The image enhancing apparatus of claim 11, wherein the first distortion level comprises information that indicates whether the first test image expands or contracts.

13. The image enhancing apparatus of claim 11, wherein the first distortion level comprises a first distortion amount based on a displacement between a feature on the first test image and a corresponding feature on the first reference image.

14. A non-transitory computer readable medium that stores a set of instructions that is executable by at least one processor of a computing device to perform a method for enhancing an image, the method comprising:
    acquiring a plurality of test images of a sample that are obtained at different landing energies;
    analyzing the acquired plurality of test images, wherein the analyzing comprises:
        determining distortion levels for the plurality of test images, wherein a distortion amount for each test image of the plurality of test images is determined; and
        comparing among the determined distortion amounts of the plurality of test images;
    determining a landing energy level that enables the sample to be in a neutral charge condition during inspection based on the distortion levels; and
    acquiring an inspection image based on the determined landing energy level.

15. The non-transitory computer readable medium of claim 14, wherein the set of instructions that is executable by at least one processor of the computing device to further perform:
    correcting the inspection image based on a reference image corresponding to the inspection image.

16. The non-transitory computer readable medium of claim 14, wherein each of the acquired plurality of test images of the sample corresponds to a test region of a plurality of test regions of the sample.

17. The non-transitory computer readable medium of claim 14, wherein determining a landing energy level enabling the sample to be in a neutral charge condition comprises estimating the landing energy level enabling a distortion amount to be zero based on the distortion levels.

18. The non-transitory computer readable medium of claim 14, wherein determining distortion levels for the plurality of test images comprises determining a first distortion level for a first test image among the plurality of test images based on a first reference image corresponding to the first test image.

19. The non-transitory computer readable medium of claim 18, wherein the first distortion level comprises information that indicates whether the first test image expands or contracts.

20. The non-transitory computer readable medium of claim 18, wherein the first distortion level comprises a first distortion amount based on a displacement between a feature on the first test image and a corresponding feature on the first reference image.

\* \* \* \* \*